US012741864B2

(12) United States Patent
Nishio

(10) Patent No.: US 12,741,864 B2
(45) Date of Patent: Sep. 22, 2026

(54) INERTIAL MEASUREMENT UNIT

(71) Applicant: SEIKO EPSON CORPORATION, Tokyo (JP)

(72) Inventor: Shinji Nishio, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 871 days.

(21) Appl. No.: 17/972,826

(22) Filed: Oct. 25, 2022

(65) Prior Publication Data

US 2023/0125187 A1 Apr. 27, 2023

(30) Foreign Application Priority Data

Oct. 27, 2021 (JP) ................................. 2021-175304

(51) Int. Cl.
*B81B 7/00* (2006.01)
*H10W 70/40* (2026.01)

(52) U.S. Cl.
CPC ......... *B81B 7/0041* (2013.01); *H10W 70/476* (2026.01); *B81B 2201/0235* (2013.01); *B81B 2201/0242* (2013.01); *B81B 2203/04* (2013.01); *B81B 2207/012* (2013.01); *B81B 2207/015* (2013.01)

(58) Field of Classification Search
CPC ...... B81B 7/0041; G01P 1/023; G01P 15/125; G01P 15/0802; H10W 70/476
See application file for complete search history.

(56) References Cited

U.S. PATENT DOCUMENTS

| | | | | |
|---|---|---|---|---|
| 2013/0032385 A1* | 2/2013 | Lin | H01L 23/315 29/841 |
| 2017/0059605 A1 | 3/2017 | Saito et al. | |
| 2020/0378764 A1* | 12/2020 | Kihara | G01D 11/245 |
| 2022/0099698 A1 | 3/2022 | Sakuma et al. | |

FOREIGN PATENT DOCUMENTS

| | | | |
|---|---|---|---|
| JP | 10-116937 A | 5/1998 | |
| JP | 2017-049122 A | 3/2017 | |
| JP | 2022-054045 A | 4/2022 | |
| WO | WO-2017002528 A1 * | 1/2017 | B81B 7/02 |

* cited by examiner

*Primary Examiner* — Richard A Booth
(74) *Attorney, Agent, or Firm* — Rankin, Hill & Clark LLP

(57) ABSTRACT

An inertial measurement unit includes: an inertial sensor module having a first inertial sensor and having an outer shape molded with a first resin; a component part; a second resin molding the inertial sensor module and the component part; and a metal provided between the first resin of the inertial sensor module and the second resin.

8 Claims, 8 Drawing Sheets

INERTIAL MEASUREMENT UNIT

The present application is based on, and claims priority from JP Application Serial Number 2021-175304, filed Oct. 27, 2021, the disclosure of which is hereby incorporated by reference herein in its entirety.

BACKGROUND

1. Technical Field

The present disclosure relates to an inertial measurement unit.

2. Related Art

Recently, an inertial sensor produced using MEMS (micro-electromechanical systems) technology has been developed. As a sensor unit using such an inertial sensor, for example, JP-A-2017-49122 discloses a sensor unit having: a sensor device having an inertial sensor sealed with a sealing resin and an electrode coupled to the inertial sensor and arranged at an outer surface of the sealing resin; a substrate with the sensor device joined thereto; a case member accommodating the sensor device; and an adhesive member provided in such a way as to couple the sensor device and the case member together.

However, the inertial sensor described in JP-A-2017-49122 is sealed with the sealing resin and the adhesive member is arranged at the outside thereof. Therefore, moisture in the adhesive member may affect the measurement by the sensor device.

SUMMARY

An inertial measurement unit includes: an inertial sensor module having a first inertial sensor and having an outer shape molded with a first resin; a component part; a second resin molding the inertial sensor module and the component part; and a metal provided between the first resin of the inertial sensor module and the second resin.

DESCRIPTION OF EXEMPLARY EMBODIMENTS

1. First Embodiment

First, an inertial measurement unit 1 according to a first embodiment will be described with reference to FIGS. 1 and 2.

Figure 1:
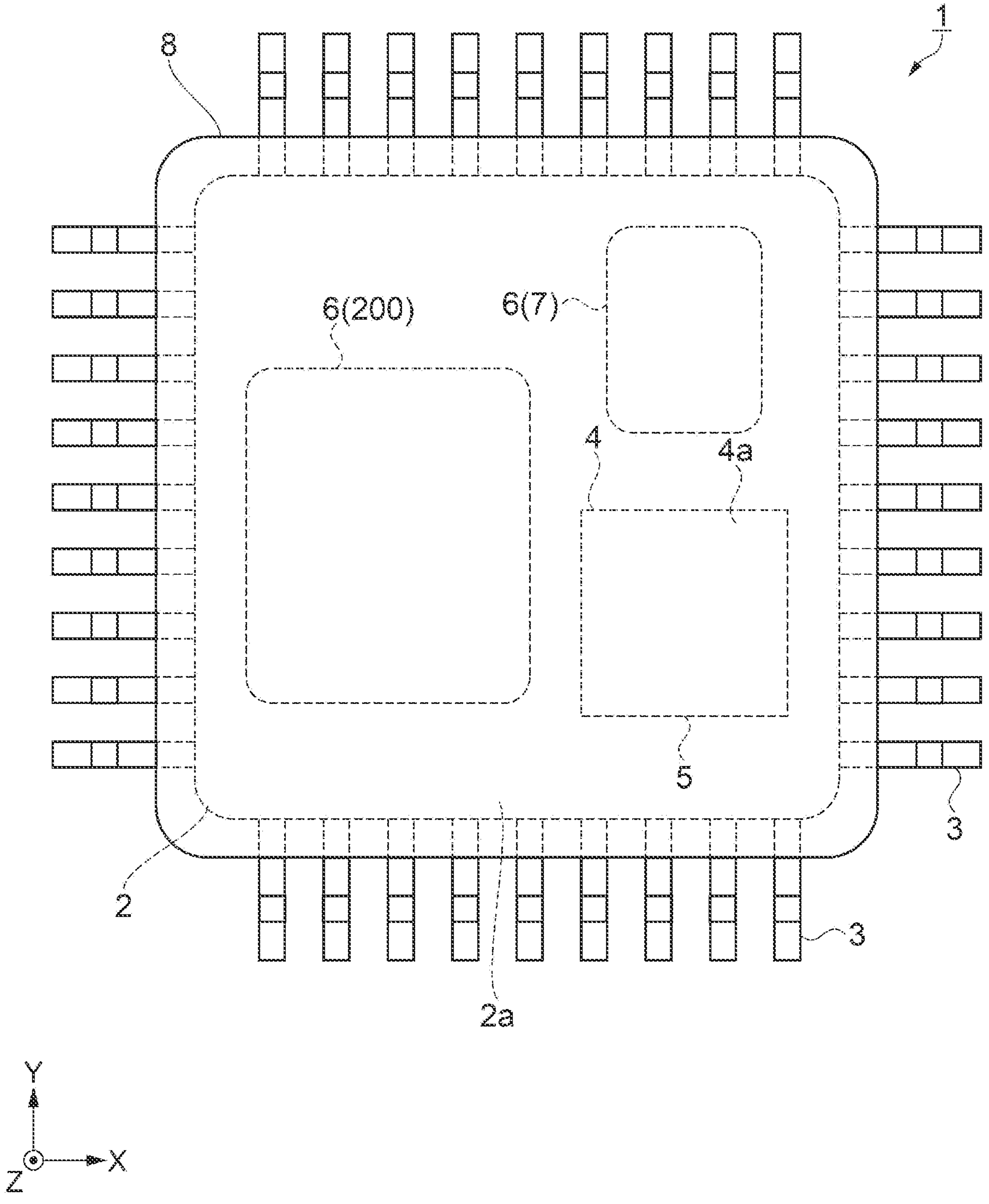
FIG. 1 is a plan view showing a schematic structure of an inertial measurement unit according to a first embodiment.
Figure 2:
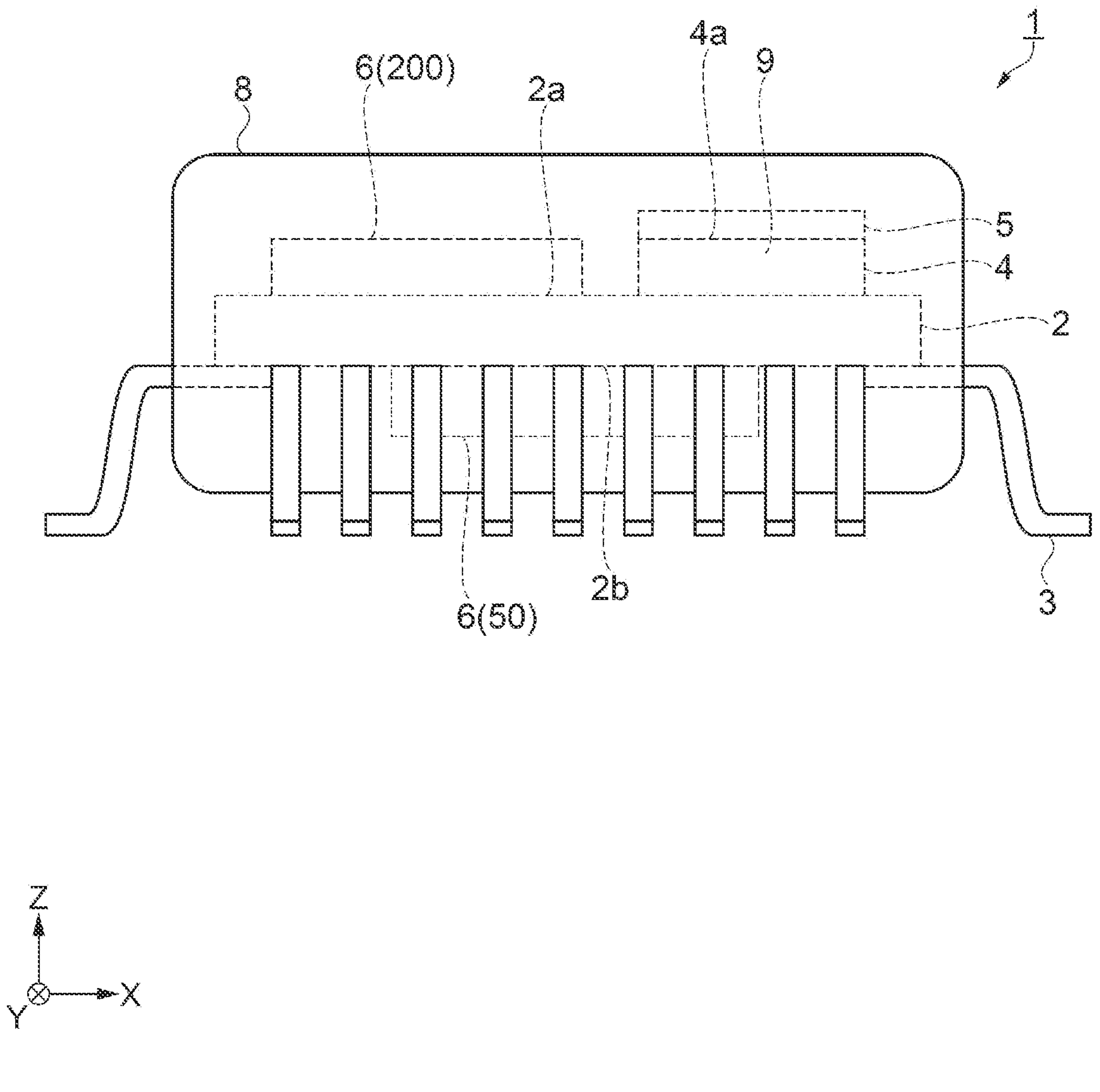
FIG. 2 is a side view of the inertial measurement unit shown in FIG. 1.

In FIGS. 1 and 2, for the sake of convenience of the description, a wiring electrically coupling a semiconductor element 50 and a lead terminal 3 that are formed at a base substrate 2, and a wiring electrically coupling the semiconductor element 50 and an inertial sensor module 4 or each component part 6, are not illustrated.

In the plan views, the side views, and the cross-sectional views described below, an X-axis, a Y-axis, and a Z-axis are shown as three axes orthogonal to each other. In this specification, the X-axis is a first axis, the Y-axis is a second axis, and the Z-axis is a third axis. A direction along the X-axis is referred to as an “X-direction”. A direction along the Y-axis is referred to as a “Y-direction”. A direction along the Z-axis is referred to as a “Z-direction”. The distal end side of an arrow along each axial direction is referred to as a “positive side”. The proximal end side is referred to as a “negative side”. The positive side along the Z-direction is also referred to as “up” or “top”. The negative side along the Z-direction is also referred to as “down” or “bottom”. The Z-direction is along a vertical direction. An XY plane is along a horizontal plane. In this specification, the X-direction, the Y-direction, and the Z-direction include both the positive direction and the negative direction.

The inertial measurement unit 1 according to this embodiment has the base substrate 2 having a plurality of lead terminals 3, the inertial sensor module 4 having an outer shape molded with a first resin 9, a metal 5 arranged at a top surface 4*a* of the inertial sensor module 4, the component part 6 such as a second inertial sensor 200, an oscillator 7 or the semiconductor element 50, and a second resin 8 molding the base substrate 2, the inertial sensor module 4, the metal 5, and the component part 6 or the like, as shown in FIGS. 1 and 2. That is, the inertial measurement unit 1 has an outer shape molded with the second resin 8 and is formed of a resin package made of the second resin 8. An end part of the lead terminal 3 on the side opposite to the base substrate 2 is exposed from the second resin 8.

The base substrate 2 is a flat plate and has the inertial sensor module 4, the second inertial sensor 200, and the oscillator 7 arranged at a top surface 2*a* and has the semiconductor element 50 and the plurality of lead terminals 3 arranged at a bottom surface 2*b*, the lead terminals 3 extending to outside of the base substrate 2 from the outer edge of the base substrate 2.

The inertial sensor module 4 will now be described in detail with reference to FIGS. 3 to 5.

Figure 3:
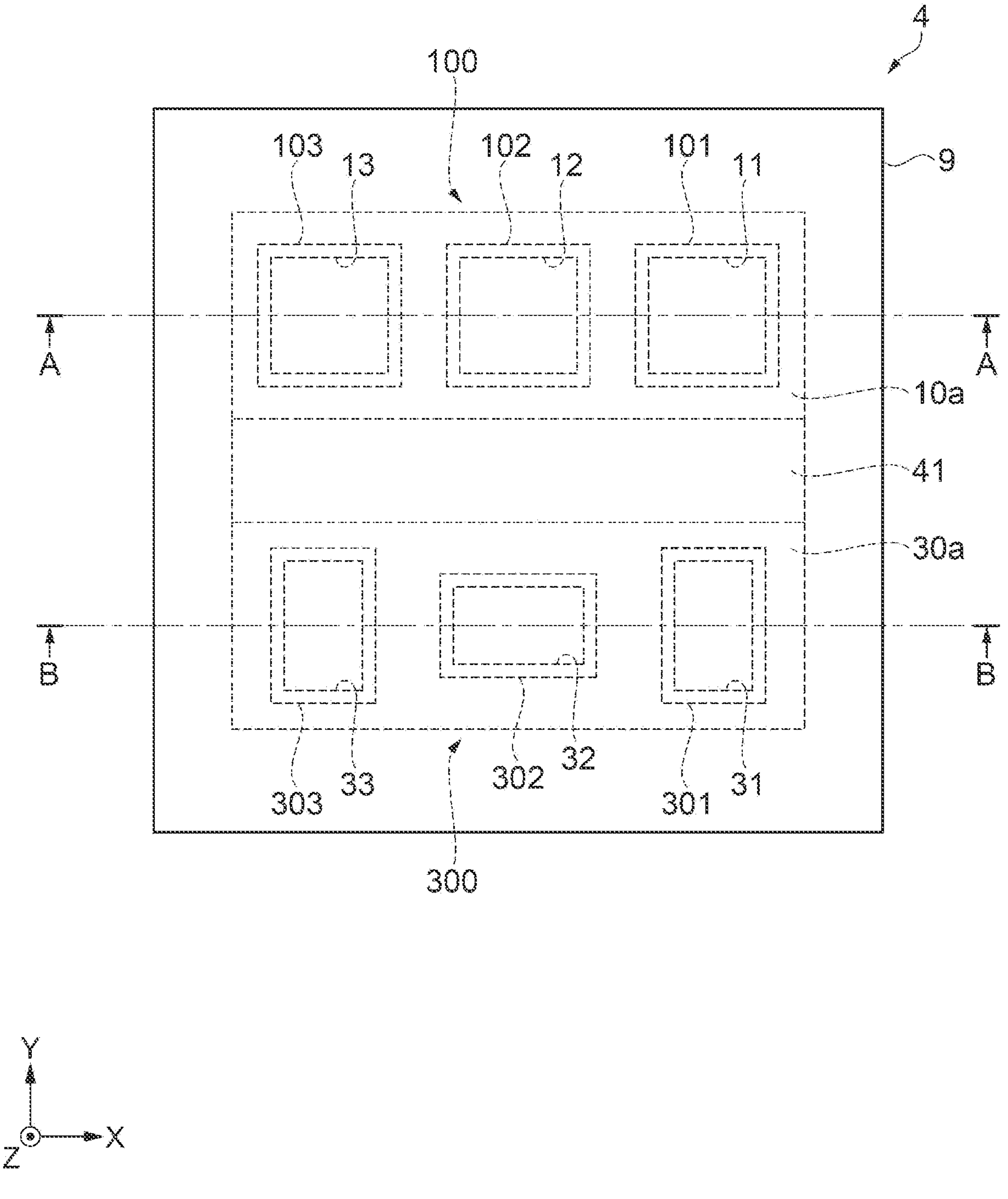
FIG. 3 is a plan view showing a schematic structure of an inertial sensor module shown in FIG. 1.
Figure 4:
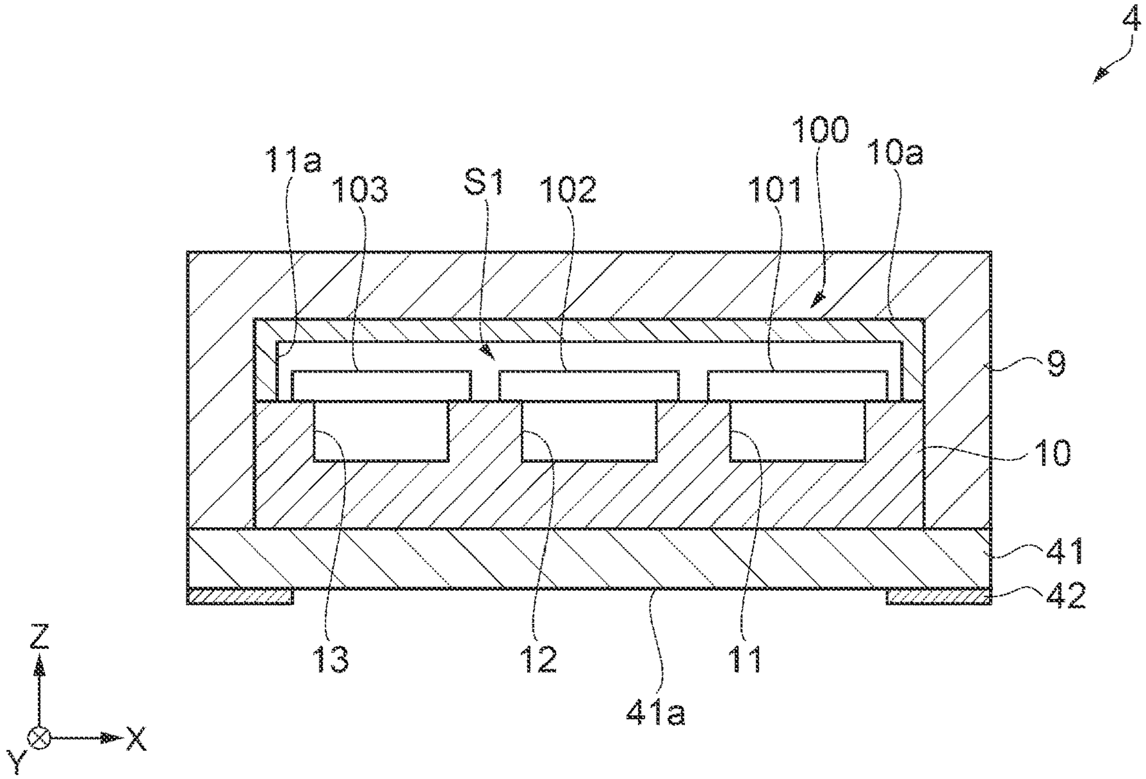
FIG. 4 is a cross-sectional view taken along a line A-A in FIG. 3.
Figure 5:
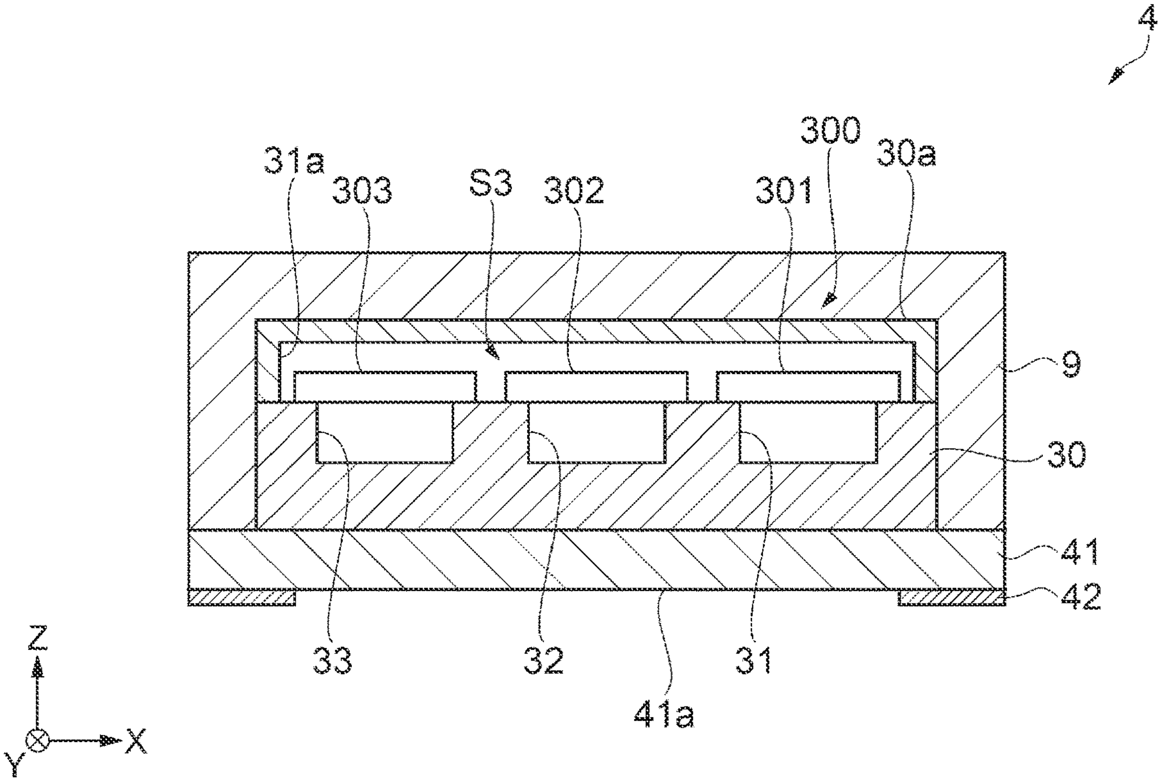
FIG. 5 is a cross-sectional view taken along a line B-B in FIG. 3.

In FIGS. 3 to 5, for the sake of convenience of the description, a wiring electrically coupling sensor elements 101, 102, 103, 301, 302, 303 and a mounting terminal 42 formed at a bottom surface 41*a* of a base substrate 41 is not illustrated. In FIGS. 3 to 5, the illustration of a first gyro sensor element 101, a second gyro sensor element 102, a third gyro sensor element 103, a first acceleration sensor element 301, a second acceleration sensor element 302, and a third acceleration sensor element 303 is simplified.

As shown in FIGS. 3 to 5, the inertial sensor module 4 has a first inertial sensor 100, a third inertial sensor 300, the base substrate 41 where the first inertial sensor 100 and the third inertial sensor 300 are arranged, and the first resin 9 molding the first inertial sensor 100 and the third inertial sensor 300. That is, the inertial sensor module 4 has an outer shape molded with the first resin 9 and is formed of a resin package made of the first resin 9. A plurality of mounting terminals 42 are formed at the bottom surface 41*a* of the base substrate 41.

The first inertial sensor 100 is a three-axis physical quantity sensor. The physical quantity is angular velocity, for example, and may also be acceleration or other physical quantities. For example, when the physical quantity is angular velocity, the first inertial sensor 100 is a three-axis angular velocity sensor. For example, when the physical quantity is acceleration, the first inertial sensor 100 is a three-axis acceleration sensor.

The first inertial sensor 100 in this embodiment is a three-axis gyro sensor that has the first gyro sensor element 101, the second gyro sensor element 102, and the third gyro sensor element 103 and that can measure an angular velocity about each detection axis of the X-axis, which is the first axis, the Y-axis, which is the second axis, and the Z-axis, which is the third axis. The first gyro sensor element 101, the second gyro sensor element 102, and the third gyro sensor element 103 are gyro sensor elements produced by processing a silicon substrate, using the MEMS technology. The first gyro sensor element 101, the second gyro sensor element 102, and the third gyro sensor element 103 detect an angular velocity, based on a change in capacitance between a movable electrode and a fixed electrode.

As shown in FIGS. 3 and 4, the first inertial sensor 100 has a substrate 10, a lid 10*a*, the first gyro sensor element 101, the second gyro sensor element 102, and the third gyro sensor element 103. The first gyro sensor element 101, the second gyro sensor element 102, and the third gyro sensor element 103 are accommodated in an internal space S1 formed by the substrate 10 and the lid 10*a*. The internal space S1 is an airtight space and is in a pressure-reduced state and preferably in an almost vacuum state.

In the first inertial sensor 100, the first gyro sensor element 101 detects an angular velocity about the X-axis. The second gyro sensor element 102 detects an angular velocity about the Y-axis. The third gyro sensor element 103 detects an angular velocity about the Z-axis.

Three downwardly depressed recesses 11, 12, 13 are formed on the substrate 10. The first gyro sensor element 101, the second gyro sensor element 102, and the third gyro sensor element 103 are arranged at the top of the substrate 10, corresponding to the recess 11, the recess 12, and the recess 13, respectively. The recesses 11, 12, 13 function as a clearance to prevent the gyro sensor elements 101, 102, 103, respectively, from coming into contact with the substrate 10.

The substrate 10 is formed of a glass material containing alkali metal ions, for example, Pyrex (trademark registered) glass, as a principal material. Thus, the gyro sensor elements 101, 102, 103 formed of a silicon substrate and the substrate 10 can be firmly joined together by anodic bonding.

An upwardly depressed recess 11*a* is formed on the lid 10*a*. As the lid 10*a* is joined to the substrate 10, the internal space S1 is formed and can accommodate the first gyro sensor element 101, the second gyro sensor element 102, and the third gyro sensor element 103.

In this embodiment, the lid 10*a* is formed of a silicon substrate. Thus, the lid 10*a* and the substrate 10 can be firmly joined together by anodic bonding.

The third inertial sensor 300 is a three-axis acceleration sensor that has the first acceleration sensor element 301, the second acceleration sensor element 302, and the third acceleration sensor element 303 and that can measure an acceleration on each detection axis in the X-direction, which is the first axis, the Y-direction, which is the second axis, and the Z-direction, which is the third axis. The first acceleration sensor element 301, the second acceleration sensor element 302, and the third acceleration sensor element 303 are acceleration sensor elements produced using the MEMS technology. The first acceleration sensor element 301, the second acceleration sensor element 302, and the third acceleration sensor element 303 detect an acceleration, based on a change in capacitance between a movable electrode and a fixed electrode.

As shown in FIGS. 3 and 5, the third inertial sensor 300 has a substrate 30, a lid 30*a*, the first acceleration sensor element 301, the second acceleration sensor element 302, and the third acceleration sensor element 303. The first acceleration sensor element 301, the second acceleration sensor element 302, and the third acceleration sensor element 303 are accommodated in an internal space S3 formed by the substrate 30 and the lid 30*a*. The internal space S3 is an airtight space with an inert gas such as nitrogen, helium or argon encapsulated therein and is used at a temperature of approximately −40° C. to 125° C. and preferably has a pressure substantially equal to atmospheric pressure. However, the atmosphere in the internal space S3 is not particularly limited and may be, for example, a pressure-reduced state or a pressurized state.

In the third inertial sensor 300, the first acceleration sensor element 301 detects an acceleration in the X-direction. The second acceleration sensor element 302 detects an acceleration in the Y-direction. The third acceleration sensor element 303 detects an acceleration in the Z-direction.

Three downwardly depressed recesses 31, 32, 33 are formed on the substrate 30. The first acceleration sensor element 301, the second acceleration sensor element 302, and the third acceleration sensor element 303 are arranged at the top of the substrate 30, corresponding to the recess 31, the recess 32, and the recess 33, respectively. The recesses 31, 32, 33 function as a clearance to prevent the acceleration sensor elements 301, 302, 303, respectively, from coming into contact with the substrate 30.

The substrate 30 is formed of a glass material containing alkali metal ions, for example, Pyrex (trademark registered) glass, as a principal material. Thus, the acceleration sensor elements 301, 302, 303 formed of a silicon substrate and the substrate 30 can be firmly joined together by anodic bonding.

An upwardly depressed recess 31*a* is formed on the lid 30*a*. As the lid 30*a* is joined to the substrate 30, the internal space S3 is formed and can accommodate the first acceleration sensor element 301, the second acceleration sensor element 302, and the third acceleration sensor element 303.

In this embodiment, the lid 30*a* is formed of a silicon substrate. Thus, the lid 30*a* and the substrate 30 can be firmly joined together by anodic bonding.

Therefore, the inertial sensor module 4 is a six-axis combination sensor having a three-axis gyro sensor and a three-axis acceleration sensor.

In this embodiment, the inertial sensor module 4 is equipped with the first inertial sensor 100, which is a three-axis gyro sensor, and the third inertial sensor 300, which is a three-axis acceleration sensor. However, the inertial sensor module 4 need not be limited to this configuration. The inertial sensor module 4 may be equipped with one of the first inertial sensor 100 and the third inertial sensor 300.

The metal 5 is a flat plate and is arranged at the top surface 4*a* of the inertial sensor module 4 in such a way as to overlap the top surface 4*a* and cover the top surface 4*a* as viewed in a plan view, as shown in FIGS. 1 and 2. The metal 5 is provided between the first resin 9 of the inertial sensor module 4 and the second resin 8. Therefore, when the inertial sensor module 4 installed at the base substrate 2 is sealed with the second resin 8, moisture contained in the second resin 8 can be prevented from permeating the first resin 9 of the inertial sensor module 4 and the influence of the moisture on the measurement by the inertial sensor module 4 can thus be reduced.

The second inertial sensor 200 will now be described in detail with reference to FIGS. 6 and 7.

Figure 6:
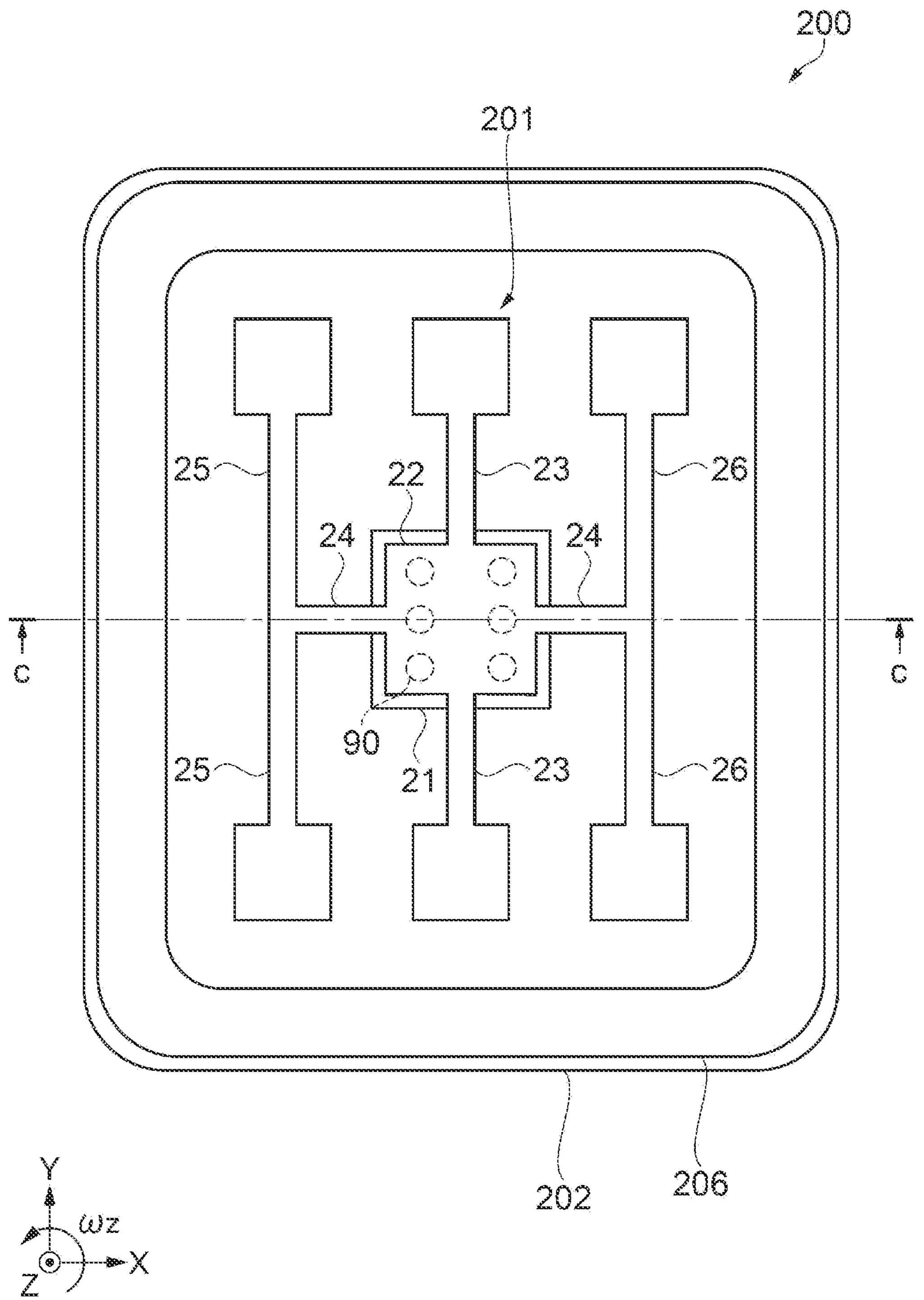
FIG. 6 is a plan view showing a schematic structure of a second inertial sensor shown in FIG. 1.

In FIG. 6, for the sake of convenience of the description, a lid 207 is not illustrated. In FIGS. 6 and 7, a wiring electrically coupling a vibration gyro sensor element 201 and a mounting terminal 205 formed at a base 202, and a drive electrode and a detection electrode formed at the vibration gyro sensor element 201, are not illustrated.

The second inertial sensor 200 is one of the component parts 6 and is a one-axis gyro sensor that has the vibration gyro sensor element 201 and that can measure an angular velocity about the detection axis of the Z-axis, which is the third axis. The vibration gyro sensor element 201 is a gyro sensor element produced by processing a quartz crystal substrate, using the photolithography technology. The vibration gyro sensor element 201 converts a vibration of a detection vibration arm into an electrical signal and thus detects an angular velocity. The vibration gyro sensor element 201 uses a quartz crystal as a base material and therefore has an excellent temperature characteristic. Therefore, the vibration gyro sensor element 201 is less susceptible to the influence of external noise and temperature and has higher detection accuracy than a gyro sensor element produced using the MEMS technology. That is, the detection accuracy of the second inertial sensor 200 is higher than the detection accuracy of the first inertial sensor 100.

Figure 7:
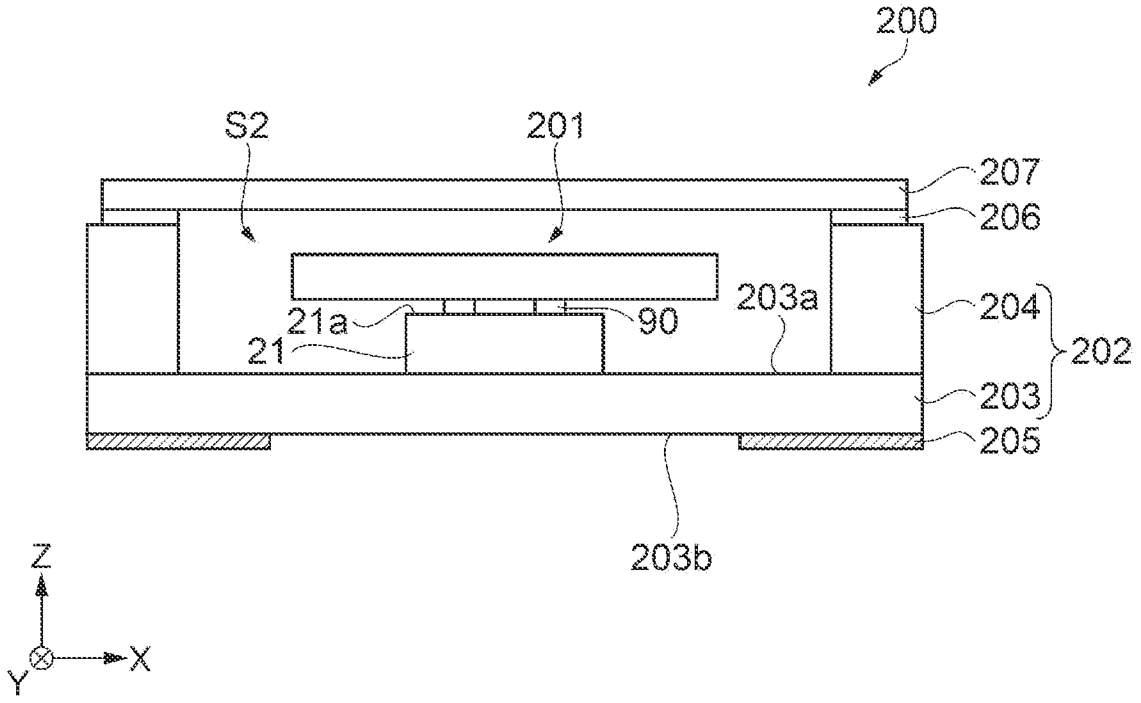
FIG. 7 is a cross-sectional view taken along a line C-C in FIG. 6.

The second inertial sensor 200 has the vibration gyro sensor element 201, the base 202 made of a ceramic or the like accommodating the vibration gyro sensor element 201, and the lid 207 made of a glass, a ceramic or a metal or the like, as shown in FIGS. 6 and 7.

The base 202 is formed of a plate-like first substrate 203 and a frame-like second substrate 204 stacked on each other. The base 202 has an internal space S2 open at the top. The internal space S2 accommodating the vibration gyro sensor element 201 is sealed airtightly in a pressure-reduced state and preferably in an almost vacuum state by having the lid 207 joined via a joining member 206 such as a seal ring.

An upwardly protruding protrusion 21 is formed at a top surface 203*a* of the first substrate 203 of the base 202. The vibration gyro sensor element 201 is electrically and mechanically fixed to a top surface 21*a* of the protrusion 21 via a metal bump 90 or the like. Therefore, the vibration gyro sensor element 201 and the first substrate 203 can be prevented from coming into contact with each other.

A plurality of mounting terminals 205 are provided at a bottom surface 203*b* of the first substrate 203 of the base 202. The mounting terminals 205 are electrically coupled to the vibration gyro sensor element 201 via a wiring not illustrated.

The vibration gyro sensor element 201 has a base part 22 located at a central part, a pair of detection vibration arms 23 extending in the Y-direction from the base part 22, a pair of coupling arms 24 extending in the X-direction from the base part 22 in such a way as to be orthogonal to the detection vibration arms 23, a pair of drive vibration arms 25 and a pair of drive vibration arms 26 extending in the Y-direction from the distal end side of the individual coupling arms 24 in such a way as to be parallel to the detection vibration arms 23. The vibration gyro sensor element 201 is electrically and mechanically fixed, at the base part 22, to the top surface 21*a* of the protrusion 21 provided at the base 202 via the metal bump 90 or the like.

When an angular velocity ωz about the Z-axis is applied to the vibration gyro sensor element 201 in the state where the drive vibration arms 25, 26 are performing flexural vibration in the opposite phases in the X-direction, a Coriolis force in the Y-direction acts on the drive vibration arms 25, 26 and the coupling arms 24 and therefore the drive vibration arms 25, 26 and the coupling arms 24 vibrate in the Y-direction. This vibration causes the detection vibration arms 23 to perform flexural vibration in the X-direction. Therefore, a detection electrode formed at the detection vibration arms 23 detects a strain in the quartz crystal generated by the vibration, as an electrical signal, and thus finds the angular velocity ωz.

In this embodiment, the second inertial sensor 200 is a one-axis gyro sensor that can measure an angular velocity about the Z-axis, which is the third axis. However, the second inertial sensor 200 need not be limited to this configuration and may be a one-axis gyro sensor that can measure an angular velocity about the X-axis, which is the first axis, or an angular velocity about the Y-axis, which is the second axis. The second inertial sensor 200 may also be a one-axis acceleration sensor that has higher detection accuracy than the third inertial sensor 300 and that can measure an acceleration in the X-direction, which is the first axis, an acceleration in the Y-direction, which is the second axis, or an acceleration in the Z-direction, which is the third axis. Also, the second inertial sensor 200 uses a sensor element formed of a quartz crystal as a base material but need not be limited to this configuration. The second inertial sensor 200 may be any sensor having higher detection accuracy than the first inertial sensor 100 and the third inertial sensor 300.

The oscillator 7 is one of the component parts 6 and is arranged at the top surface 2*a* of the base substrate 2, as shown in FIG. 1. The oscillator 7 outputs a clock signal to the semiconductor element 50. Based on the clock signal, the semiconductor element 50 controls the detection timing and the detection time for the angular velocities and the accelerations detected by the individual sensors 100, 200, 300.

The semiconductor element 50 is one of the component parts 6 and is arranged at the bottom surface 2*b* of the base substrate 2, as shown in FIG. 2. The semiconductor element 50 includes a drive circuit driving the individual sensors 100, 200, 300, a detection circuit detecting angular velocities about the three axes and accelerations in the three axes directions, based on signals from the individual sensors 100, 200, 300, and an output circuit converting a signal from the detection circuit into a predetermined signal and outputting the predetermined signal, or the like.

The second resin 8 molds the base substrate 2, the inertial sensor module 4, the metal 5, the component part 6, and a part of the lead terminal 3. That is, the inertial measurement unit 1 has an outer shape molded with the second resin 8 and is formed of a resin package made of the second resin 8.

As described above, in the inertial measurement unit 1 according to this embodiment, the metal 5 is provided between the first resin 9 forming the package of the inertial sensor module 4 and the second resin 8 forming the package of the inertial measurement unit 1. Therefore, when the inertial sensor module 4 installed at the base substrate 2 is molded with the second resin 8, moisture contained in the second resin 8 can be prevented from permeating the first resin 9 of the inertial sensor module 4 and the influence of the moisture on the measurement by the inertial sensor module 4 can be reduced. Thus, the inertial measurement unit 1 having excellent detection accuracy can be provided.

The inertial measurement unit 1 according to this embodiment has the second inertial sensor 200 having higher detection accuracy than the first inertial sensor 100 and using the Z-axis, which is the third axis, as the detection axis. Therefore, the inertial measurement unit 1 having more excellent detection accuracy can be provided.

2. Second Embodiment

Figure 8:
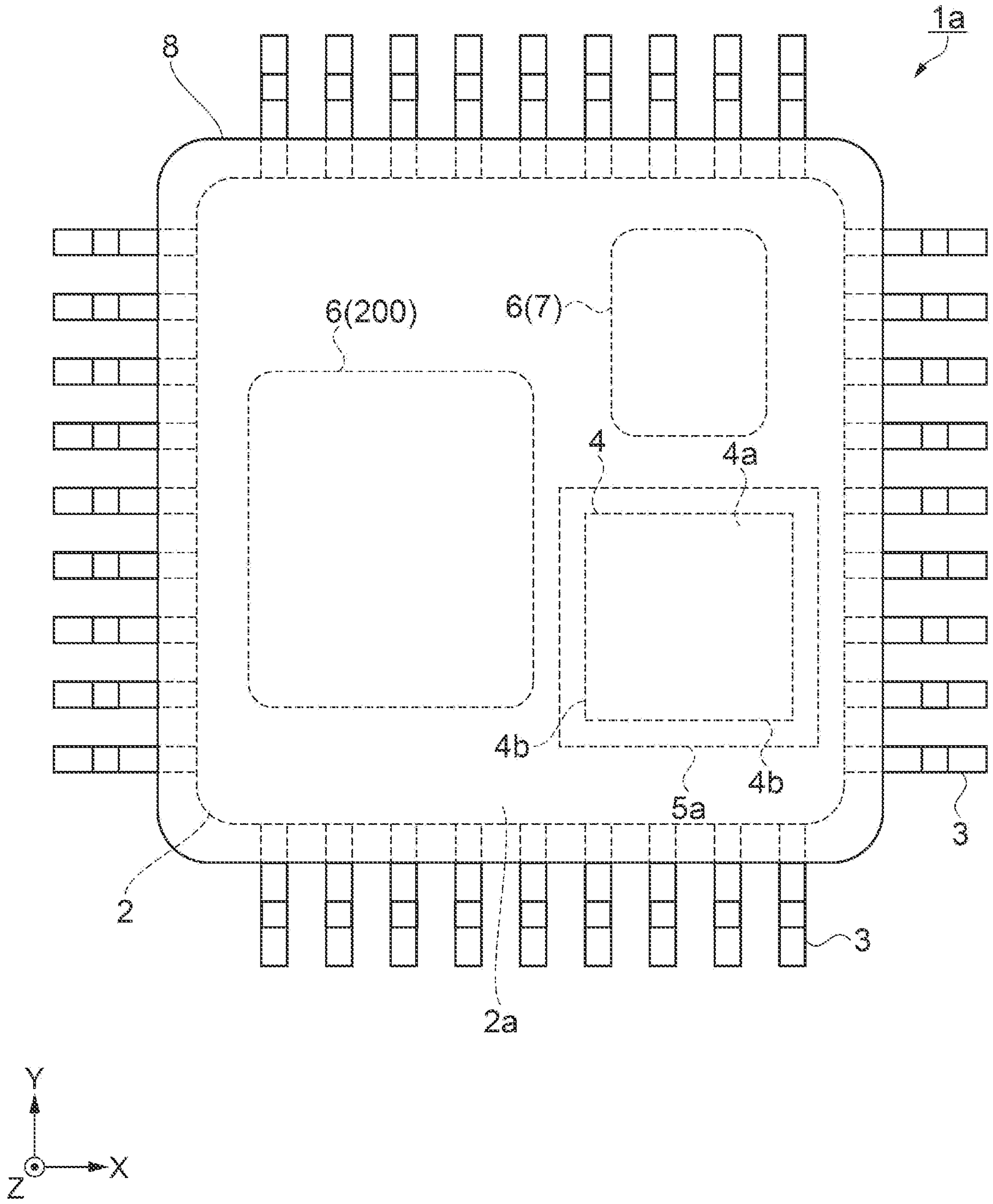
FIG. 8 is a plan view showing a schematic structure of an inertial measurement unit according to a second embodiment.
Figure 9:
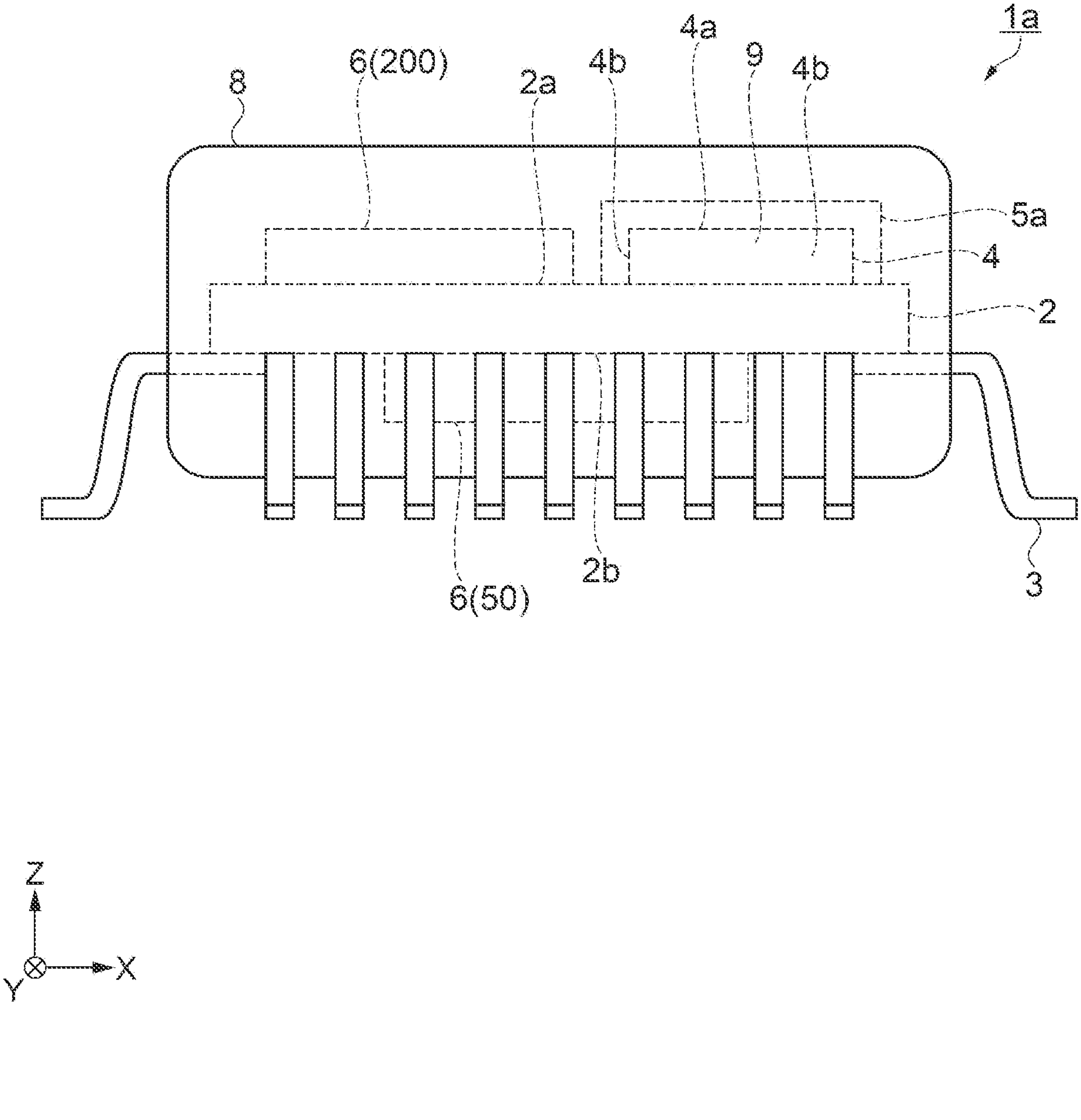
FIG. 9 is a side view of the inertial measurement unit shown in FIG. 8.

An inertial measurement unit la according to a second embodiment will now be described with reference to FIGS. 8 and 9. In FIGS. 8 and 9, for the sake of convenience of the description, a wiring electrically coupling the semiconductor element 50 and the lead terminal 3 that are formed at the base substrate 2, and a wiring electrically coupling the semiconductor element 50 and the inertial sensor module 4 or each component part 6, are not illustrated.

The inertial measurement unit la according to this embodiment is similar to the inertial measurement unit 1 according to the first embodiment except that the shape of a metal 5*a* arranged at the top surface 4*a* of the inertial sensor module 4 is different. The difference from the first embodiment is mainly described and the description of similar matters is omitted.

In the inertial measurement unit la, the metal 5*a* arranged at the top surface 4*a* of the inertial sensor module 4 covers the top surface 4*a* of the inertial sensor module 4 and four side surfaces 4*b* of the inertial sensor module 4, as shown in FIGS. 8 and 9. Therefore, the moisture of the second resin 8 can be prevented from permeating not only from the top surface 4*a* of the inertial sensor module 4 but also from the four side surfaces 4*b*.

Such a configuration can achieve effects similar to those of the inertial measurement unit 1 according to the first embodiment.

What is claimed is:

1. An inertial measurement unit comprising:

an inertial sensor module having a first inertial sensor, the inertial sensor module having an outer shape with a top surface and a side surface molded with a first resin;

a component part;

a second resin molding the inertial sensor module and the component part, the second resin forming a resin package being an outer shape of the inertial measurement unit; and a metal provided between the first resin of the inertial sensor module and the second resin, the metal in direct contact with and covering the top surface of the outer shape of the inertial sensor module.

2. The inertial measurement unit according to claim 1, wherein the metal covers the top surface and the side surface of the outer shape of the inertial sensor module.

3. The inertial measurement unit according to claim 1, wherein the first inertial sensor uses each of a first axis, a second axis, and a third axis that are orthogonal to each other, as a detection axis.

4. The inertial measurement unit according to claim 3, wherein the component part includes a second inertial sensor having higher detection accuracy than the first inertial sensor and using the third axis as a detection axis.

5. The inertial measurement unit according to claim 1, wherein the component part includes a semiconductor element controlling the first inertial sensor.

6. The inertial measurement unit according to claim 1, wherein the first inertial sensor has a substrate, a lid, and at least one sensor element accommodated in an internal space formed by the substrate and the lid, and the substrate is formed with at least one downwardly depressed recess with the at least one sensor element arranged at a top of the substrate corresponding to the at least one recess.

7. The inertial measurement unit according to claim 6, wherein the outer shape of the inertial sensor module molded with the first resin is defined by the substrate and the lid.

8. The inertial measurement unit according to claim 1, wherein the metal is a flat plate.

* * * * *